United States Patent [19]

Garg et al.

[11] Patent Number: 5,146,481
[45] Date of Patent: Sep. 8, 1992

[54] DIAMOND MEMBRANES FOR X-RAY LITHOGRAPHY

[76] Inventors: Diwakar Garg, 2815 Whitemarsh Pl.; Vyril A. Monk, P.O. Box 496, 6563 Mountain Rd., both of Macungie, Pa. 18062; Carl F. Mueller, 1221 Tatamy Rd., Easton, Pa. 18042

[21] Appl. No.: 720,605

[22] Filed: Jun. 25, 1991

[51] Int. Cl.$^5$ .............................. G21K 5/00; B01J 3/06
[52] U.S. Cl. .............................. 378/35; 156/DIG. 68; 423/446; 427/249
[58] Field of Search ...................... 378/34, 35; 427/38, 427/39, 249; 423/446; 156/DIG. 68; 430/5

[56] References Cited

U.S. PATENT DOCUMENTS

| | | |
|---|---|---|
| 3,742,230 | 6/1973 | Spears et al. |
| 3,925,677 | 12/1975 | Fraser |
| 4,037,111 | 7/1977 | Coquin et al. |
| 4,198,263 | 4/1980 | Matsuda |
| 4,260,670 | 4/1981 | Burns |
| 4,436,797 | 3/1984 | Brady et al. |
| 4,604,294 | 8/1986 | Tanaka et al. ........... 427/53.1 |
| 4,859,490 | 8/1989 | Ikegaya et al. ........... 427/38 |
| 4,869,923 | 9/1989 | Yamazaki ............... 427/122 |
| 5,006,203 | 4/1991 | Purdes ................. 156/DIG. 68 |
| 5,075,094 | 12/1991 | Morrish et al. ........ 156/DIG. 68 |

FOREIGN PATENT DOCUMENTS

| | | |
|---|---|---|
| 0254312 | 7/1987 | European Pat. Off. |
| 0254560 | 7/1987 | European Pat. Off. |
| 62-17152 | 1/1987 | Japan |
| 62-89586 | 4/1987 | Japan |
| 63-979 | 1/1988 | Japan |
| 63-159292 | 7/1988 | Japan |
| 64230078 | 3/1989 | Japan |

OTHER PUBLICATIONS

Y. C. Ku, et al., "Use of Ion Implantation to Eliminate Stress-Induced Distortion in X-Ray Masks", J. Vac. Sci. Technol. B, vol. 6, No. 6 Nov./Dec. 1988.
C. E. Uzoh et al., "Mechanical Characterization of Membranes for X-Ray Lithography Masks" J. Vac.Sci. Technol. B, vol. 6, No. 6 Nov./Dec. 1988.
C. R. Aiyer et al., "Effect of Mixing Oxygen or Diborane on the Formation of Amorphous Carbon Films From Methane by R.F. Plasma Chemical Vapor Deposition"; Thin Solid Films, 163 1988 299-232.
M. Yamada et al., "An X-Ray Mask Using TA and Heteroepitaxially Grown, etc." Microelectronic Engineering 9 (1989) 135-138.
U. Mackens et al., "Application of Sig-X-Ray Masks for Fabricating SubMicron Devices"; SPIE vol. 923 Electron-Beam, X-Ray, & Ion-Beam Tech. pp. 9-15 (1988).
Suzuki, K., "Versatile X-Ray Mask Fabrication Techniques", SPIE vol. 773 Electron-Beam, X-Ray and ion-Beam Lithographies VI (1987) pp. 23-29.
B. Singh et al., "Growth of Polycrystalline Diamond Particles and Films by Hot-Filament Chemical Vapor Deposition" David Sarnoff Rearch Center, CN-5300, 1988.
S. Matsumoto et al., "Growth of diamond particles from methane-hydrogen gas" Nat'l Inst. Res. Inorg. Mater., baraki 305, 1982.

*Primary Examiner*—David P. Porta
*Attorney, Agent, or Firm*—McCubbrey, Bartels, Meyer & Ward

[57] ABSTRACT

A substantially compressive stress-free, pin-holes free, and defects free continuous polycrystalline diamond membrane for an x-ray lithography mask is produced by placing a prepared substrate into a hot filament chemical vapor deposition reaction chamber, pre-heating the substrate to 400° C.-650° C. in the presence of an inert gas, heating the substrate to 650° C.-700° C. in the presence of hydrogen and carbon compounds, and chemically vapor depositing a polycrystalline diamond membrane onto the substrate.

31 Claims, 5 Drawing Sheets

DIAMOND MEMBRANES FOR X-RAY LITHOGRAPHY

FIELD OF THE INVENTION

This invention relates to X-ray lithography. More particularly, the invention relates to a substantially compressive stress free, pin-holes and defects free, continuous polycrystalline diamond membrane for X-ray lithography application, and to a method for producing same.

BACKGROUND OF THE INVENTION

X-ray lithography, because of its high resolution and excellent process latitude, offers considerable benefits over other lithography methods for producing devices with lateral dimensions in the vicinity of 0.5 micron and below. The membranes that are used in X-ray lithography typically comprise a thin foil substrate supporting an X-ray absorbing pattern. Since the thin foil substrate is usually only a few micrometers thick, it usually requires an additional peripheral supporting structure.

Selection of a suitable material for the X-ray lithography membrane is not a simple process for many reasons. For example, an X-ray lithography membrane should have a usable area as large a possible (ideally as large as a silicon wafer), a thickness in the micron ($\mu$m) range, to minimize absorption of X-rays and subsequent rise in membrane temperature, virtually absolute flatness, high strength, dimensional and mechanical stability against radiation, humidity, and heat, and compatibility with X-ray absorber materials such as gold, tantalum and tungsten. The membrane must also have sufficient transparency to X-rays so that adequate contrast can be achieved, and transparency to visible light for alignment purposes.

To meet these requirements, materials such as silicon, boron doped silicon, boron nitride, silicon nitride ($Si_3N_4$ and $SiN_x$), silicon oxide ($SiO_2$ and $SiO_x$), beryllium, silicon carbide (SiC and $SiC_x$), tungsten carbide, silicon oxynitride, alumina, Mylar, and Kapton have been employed as X-ray lithography membranes. Illustrative are the following references: U.S. Pat. Nos. 3,742,230; 3,925,677; 4,037,111; 4,198,263; 4,260,670; Yamada, et al., Microelectronic Eng'r 9, 135-138 (1989); Mackens, et al., Ion-Beam Technology, Submicrometer Lithographics VII, 9-15 (1988); Suzuki, Electron Beam, X-ray and Ion Beam Lithographics VI, 23-29 (1987); Ku, et al., J. Vac. Sci. Technol. B. 6, No. 6, 2174-2177 (1988); Uzoh, et al., J. Vac. Sci. Technol. 6, No.6, 2178-2183 (1988); Aiyer, et al., Thin Solid Films 163, 229-232 (1988).

These disclosed materials meet some of the above mentioned requirements well but only marginally satisfy one or more of the other requirements. For example, membranes made of boron nitride have been noted to lose optical transparency when exposed to X-rays from a synchrotron radiation source. The optical and X-ray transparencies of many of the above described materials have also been noted to decrease with increasing thickness (generally above 1 $\mu$m). Further, because of the low thermal conductivity of the current X-ray membrane materials, the temperature of these membranes has been noted to rise with the absorption of X-rays by the absorber material. This rise in temperature coupled with the high coefficient of thermal expansion of these materials results in significant distortion of the pattern and damage to the membrane X-ray lithography membranes made out of thin diamond film (a pure crystalline carbon structure) offer a viable solution to many of the problems experienced by the current X-ray lithography membrane materials. Diamond has a high thermal conductivity ($\sim 2000$ $W^{-1} m^{-1} K^{-1}$) which facilitates the rapid dissipation of heat generated by the absorption of X-rays. It also minimizes the pattern distortion due to its low coefficient of thermal expansion ($\sim 1.1 \times 10^{-6}/°C.$) and high Young's modulus. Additionally, diamond is extremely hard, X-ray and optically transparent, and extremely durable and resistant to chemical attack. Several prior art techniques have been disclosed for producing diamond (or amorphous carbon) membranes. Illustrative are the following references: U.S. Pat. No. 4,436,797; and Japanese, Patent Application Nos. 63-979, 62-17152, and 62-89586.

U.S. Pat. No. 4,436,797 describes a process for fabricating a X-ray membrane from amorphous carbon deposited on silicon wafer by plasma assisted CVD using a mixture of hydrogen and hydrocarbon.

Japanese Patent Application No. 63-979 filed on 5 Jan. 1988 discloses a X-ray lithography membrane made of diamond film. The thickness of diamond film is claimed to be $\sim 1$ $\mu$m, and is deposited on silicon wafer by hot filament, high-frequency plasma, or microwave plasma CVD method with $CH_4/H_2$ mixture at 800° to 1000° C. and pressure of several torr. This patent application fails to provide details of essential processing parameters, such as composition and flow rate of feed gas and operating pressure, required to deposit thin diamond film either in tension or free of compressive stresses.

Japanese Patent Application No. 62-17152 filed on 29 Jan. 1987 describes the use of diamond thin film as a X-ray lithography membrane. It claims that the use of CVD diamond film as a X-ray membrane has been difficult because of rough surface finish. The surface roughness of CVD diamond has been reduced by polishing, thereby enabling one to use it as X-ray membrane. The diamond film is deposited on silicon by using either microwave plasma CVD or hot-filament CVD. A gaseous feed mixture containing !% CH4 in H2 was used at 900° C. substrate and 2000° C. filament temperatures to deposit diamond by HFCVD. This patent application fails to provide details of processing parameters required to deposit diamond film either in tension or free of compressive stresses.

Japanese Patent Application No. 62-89586 filed on 10 Apr. 1987 discloses a X-ray membrane made of carbon-based film containing diamond crystals. The carbon-based membrane is produced by ionizing a mixture of hydrogen, hydrocarbon, organic compound and inert gas by an ion beam in a vacuum chamber.

A drawback of these prior art techniques is that since the coefficient of thermal expansion of diamond ($\sim 1.1 \times 10^{-6}°C.^{-1}$) is considerably lower than that of the base silicon material ($\sim 4.2 \times 10^{-6}°C.^{-1}$), the diamond film is generally deposited with residual compressive stresses. These compressive stresses produce wrinkles in the film when the base material is removed by chemical etching, thereby producing poor quality X-ray membrane.

It is therefore an object of this invention to provide a substantially compressive stress free, pin-holes and defects free, continuous polycrystalline diamond thin membrane for X-ray lithography.

It is a further object of this invention to provide a substantially compressive stress free, substantially optically and X-ray transparent membrane for X-ray lithography.

It is a further object of this invention to provide a low cost and efficient process for producing a substantially compressive stress free, pin-holes and defects free, and substantially optically and X-ray transparent continuous polycrystalline diamond membrane for X-ray lithography.

SUMMARY OF THE INVENTION

The disclosed membrane for X-ray lithography substantially reduces or eliminates the disadvantages and shortcomings associated with the prior art techniques. The invention discloses a substantially compressive stress free, pin-holes and defects free, continuous polycrystalline diamond membrane and a peripheral supporting structure (substrate) for X-ray lithography application. The invention also discloses a method for fabricating the polycrystalline diamond X-ray lithography membrane.

According to the method, the substrate surface is initially prepared by ultrasonically bathing the substrate in a slurry of diamond particles and volatile solvent. After the substrate surface is prepared, the substrate is placed into a hot filament chemical vapor deposition reactor and pre-heated in the presence of an inert gas for a predetermined period of time. The substrate is then heated to a predetermined temperature in the presence of a gaseous mixture of flowing hydrogen and hydrocarbon compounds and the polycrystalline diamond membrane is chemically vapor deposited onto the substrate. Once the polycrystalline diamond membrane has been deposited on the substrate, the coated substrate is cooled and removed from the reactor.

An etch resistance mask is then applied to the back surface of the substrate to define one or more openings. A preferential chemical etchant is then employed to etch the back surface of the substrate, resulting in a substantially compressive stress free, pin-holes and defects free, continuous polycrystalline diamond membrane supported by a peripheral supporting structure.

BRIEF DESCRIPTION OF THE DRAWINGS

Further features and advantages of the method disclosed herein will become apparent from following and more particular description of the preferred embodiment of the invention as illustrated in the accompanying drawings, in which.

DETAILED DESCRIPTION OF THE INVENTION

In accordance with the present invention, the disclosed polycrystalline diamond membrane for X-ray lithography substantially reduces or eliminates the disadvantages and shortcomings associated with the prior art techniques. A highly important technical advantage of the invention is that the diamond membrane is substantially compressive stress-free and thereby minimizes or eliminates pattern distortion generally observed during X-ray lithography.

The disclosed polycrystalline diamond membrane is also extremely hard, durable, resistant to chemical attack, substantially optically and X-ray transparent, exhibits a high thermal conductivity which facilitates the rapid dissipation of heat generated by X-ray absorption and exhibits a low coefficient of thermal expansion which minimizes pattern distortion. In the preferred embodiment form of the invention, the diamond membrane further exhibits an adherent, coherent, and continuous polycrystalline structure. By the term of "substantially optically transparent", it is intended to mean substantially transparent to light in the visible region of the electromagnetic spectrum, which is generally between approximately 350–750 nanometers wavelength. By the term "substantially X-ray transparent", it is intended to mean substantially transport to electromagnetic radiation with less than 300 nanometers wavelength.

Figure 5:
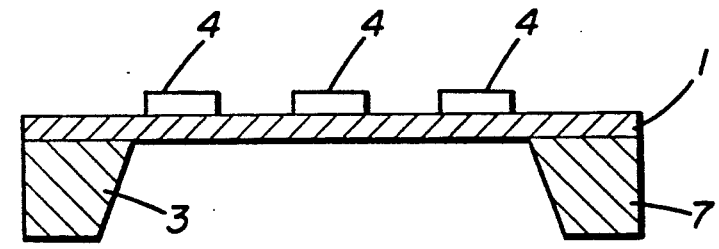

Further disclosed is a X-ray lithography mask employing the substantially compressive stress free, pin-holes and defects free, continuous polycrystalline diamond thin membrane. The X-ray lithography mask further comprises a substantially X-ray absorbing pattern 4 supported by the polycrystalline diamond membrane 1 and a substrate supporting the membrane 7 (FIG. 5). The substrate 7 on which the polycrystalline diamond membrane 1 is deposited may comprise silicon, polysilicon, alumina, titanium carbide, titanium nitrite, tungsten, silicon carbide, silicon oxynitride, boron carbide, silicon nitride, boron nitride, molybdenum, tantalum or mixtures thereof.

Figure 2:
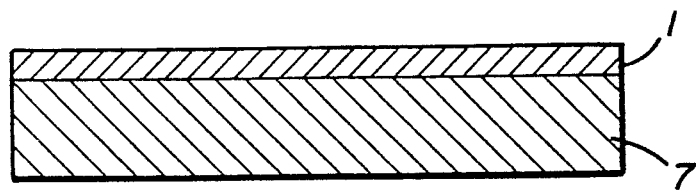
FIGS. 2–5 illustrate the step-by-step fabrication of a X-ray lithography mask using a substantially compressive stress free continuous polycrystalline diamond membrane in accordance with this invention.

In the preferred embodiment of the invention, as illustrated in FIG. 2, the polycrystalline diamond membrane 1 is chemically vapor deposited on a substrate 7 comprising silicon, glass, ceramic and/or mixtures thereof. As previously mentioned, the diamond membrane 1 is substantially compressive stress-free (i.e. no residual compressive stresses). Alternatively, the polycrystalline diamond membrane 1 may be deposited onto the substrate 7 under tensile stress. This may be achieved by using a specially designed HFCVD reactor and by carefully selecting the deposition parameters. The advantage of depositing the polycrystalline diamond membrane under tensile stress would be the membrane or the mask will have little or no distortion during use.

By the phrase "chemically vapor deposited," it is intended to mean the deposition of a layer of polycrystalline diamond resulting from the thermal decomposition of a mixture of hydrogen and carbon compounds, preferably hydrocarbons, into diamond generating carbon atoms preferentially from the gas phase activated in such a way as to avoid substantially the deposition of graphitic carbon. The specific types of carbon compounds useful in this method include $C_1$–$C_4$ saturated hydrocarbons such as methane, ethane, propane and butane; $C_1$–$C_4$ unsaturated hydrocarbons such as acetylene, ethylene, propylene and butylene; gases containing C and O such as carbon monoxide and carbon dioxide; aromatic compounds such as benzene, toluene, xylene, and the like; and organic compounds containing C, H, and at least one of oxygen and/or nitrogen such as methanol, ethanol, propanol, dimethyl ether, diethyl ether, methylamine, ethylamine, acetone, and similar materials (a detailed list of organic compounds that can be used to deposit a diamond layer is provided in U.S. Pat. No. 4,816,282, which patent is incorporated herein by reference). The organic compound can be in admixture with water as described in Japanese Kokai Patent Publication No. Sho 64(1989)-24093, published 26 Jan. 1989, which publication is incorporated herein by reference. The concentration of carbon compounds in the hydrogen gas can vary from about 0.2% to about 5.0% preferably from about 0.5% to 2.0%. The resulting diamond film in such a deposition method is in the form of adherent individual crystallites or a layer-like agglomerates of crystallites substantially free from intercrystalline adhesion binder.

The polycrystalline diamond membrane exhibits a substantially uniform thickness generally in the range of approximately 0.5 $\mu$m–4.0 $\mu$m. Preferably, the thickness of the polycrystalline diamond membrane is about 0.75 $\mu$m to 2.0 $\mu$m. The polycrystalline diamond membrane also has a diameter/thickness aspect ratio substantially greater than 1,000.

The method of the present invention teaches those skilled in the art how to fabricate the substantially compressive stress free, pin-holes and defects free, continuous polycrystalline-diamond membrane of this invention. According to the method, the first step involves preparing the surface of the substrate by ultrasonically bathing the substrate in a slurry of diamond particles and volatile solvent for a predetermined period of time, preferably approximately 0.5 hours to 6 hours. The size of diamond particles used during bathing may vary from 10 $\mu$m to 100 $\mu$m. Preferably, the size of diamond particles may be 20 $\mu$m to 35 $\mu$m. The substrate may then be cleaned with a volatile solvent and dried in the presence of an inert gas. The polycrystalline diamond membrane is then chemically vapor deposited onto the prepared substrate in an HFVCD reactor.

Figure 1A:
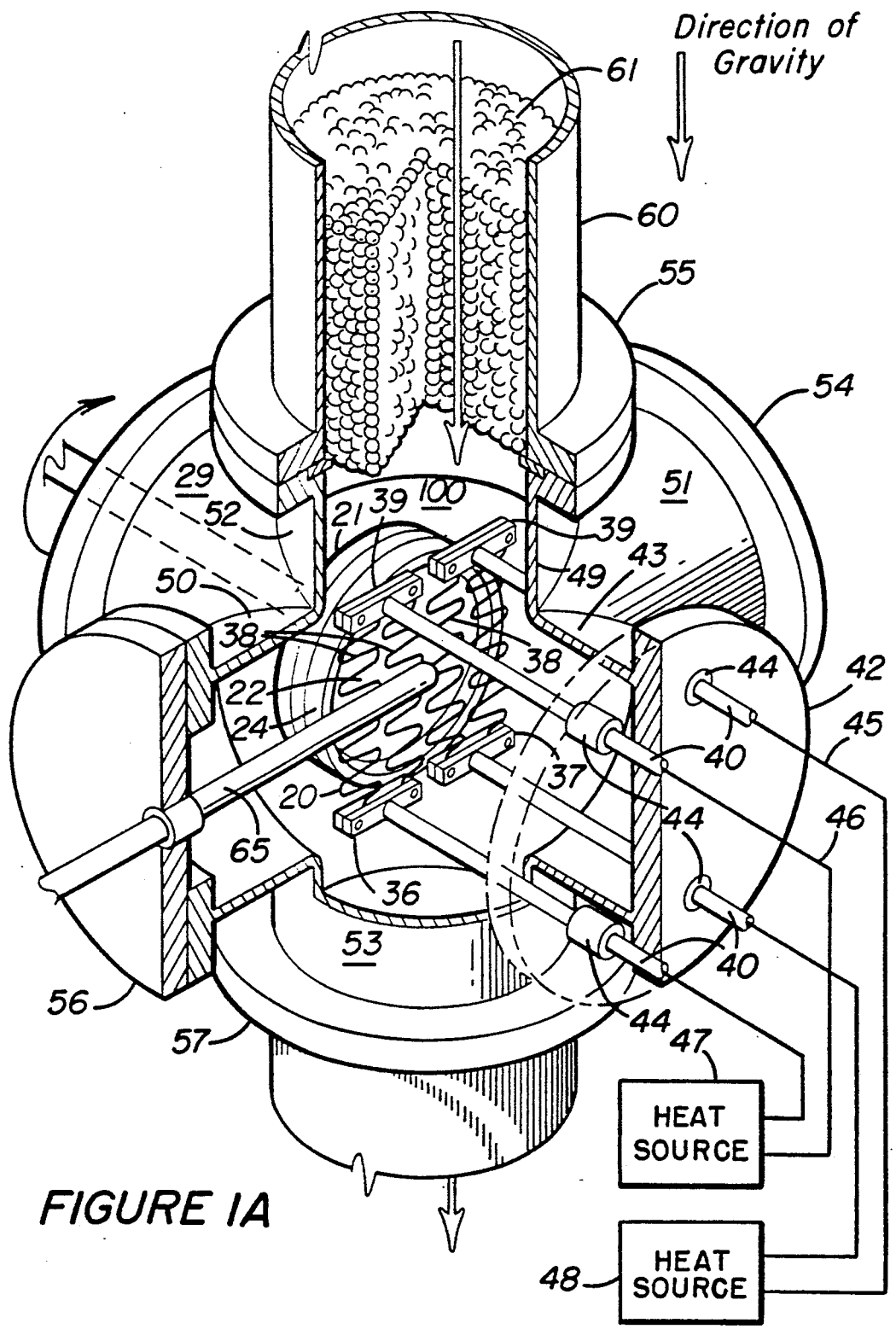
FIGS. 1A, 1B and 1C are simplified views of a type of HFCVD reactor for use in carrying out the method of the present invention.

The polycrystalline diamond membrane of the present invention may be deposited in a preferred method by using an HFCVD reactor such as the reactor illustrated in FIG. 1A. The HFCVD technique involves activating a feed gaseous mixture containing a mixture of hydrocarbon and hydrogen by a heated filament and flowing the activated gaseous mixture over a heated substrate to deposit a polycrystalline diamond membrane. The feed gas mixture, generally containing from 0.1% to about 5% hydrocarbon in hydrogen, is thermally activated under sub-atmosphere pressure ($\leq$100 torr) to produce hydrocarbon radicals and atomic hydrogen by using a heated filament made of tungsten, molybdenum, tantalum, rhenium, platinum, rhodium, zirconium, palladium, hafnium or a mixture thereof.

Figure 1B:
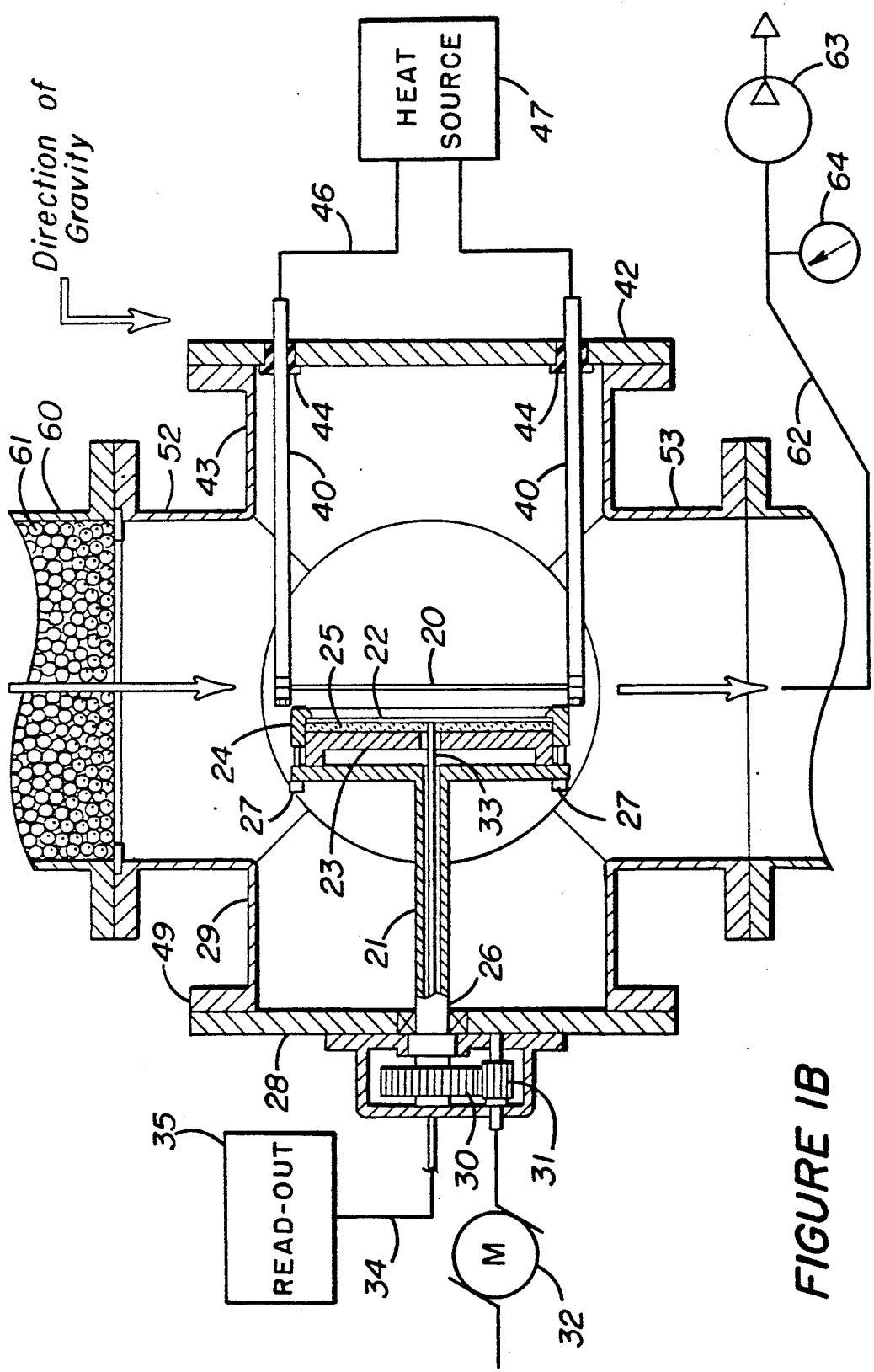

The operating parameters that have been found to be critical for depositing substantially compressive stress free, pin-holes and defects free, continuous polycrystalline diamond membranes include the substrate temperature, filament to substrate distance, total flow rate of the feed gas mixture and deposition time. In the preferred embodiment form of the invention, the substrate is initially pre-heated to a temperature in the range of about 400° C. to 650° C. in the presence of an inert gas such as helium, argon, nitrogen, zenon or krypton. The substrate temperature is determined by placing a thermocouple behind it touching the surface as shown in FIG. 1B. The substrate is generally maintained at this pre-heating temperature for approximately 10 minutes to 120 minutes, preferably to 60 minutes. The flow rate of the inert gas during the pre-heating step is generally in the range of approximately 50 sccm to 500 sccm, and maintained at a predetermined flow rate for approximately 10 min. to 120 min.

The substrate is then heated to a temperature in the range of approximately 650° C. to 700° C. in the presence of the gaseous mixture of flowing hydrogen and carbon compounds. I the preferred embodiment of the invention, the concentration of carbon compounds in the hydrogen gas is in the range of approximately 0.2% to 5.0%, preferably approximately 0.5% to 2.0%. The control of substrate or deposition temperature at or below 700° C. is critical for depositing polycrystalline diamond membranes under substantially compressive stress-free or under tensile stress, which is exhibited by wrinkle free surface topography after etching substrate. The use of deposition temperatures above 700° C. has been unexpectedly found to result in membranes under compression which is exhibited by the presence of wrinkles in the membrane upon etching.

In the preferred embodiment form of the invention, the substrate to filament network distance is generally in the range of approximately 11 mm to 20 mm. It has been found that a filament to substrate distance less than 11 mm will result in the deposition of non-uniform membranes under compression.

It has also been found that the use of high flow rate of feed gas is detrimental for producing membranes substantially free of compressive stresses. Thus, in the preferred embodiment form of the invention, the flow rate of the gaseous mixture containing 1% $CH_4$ in $H_2$ during the chemical vapor deposition step is generally in the range of approximately 10 sccm to 605 sccm. The total flow rate may change with the concentration of $CH_4$ in $H_2$ and with the type of carbon compounds used during deposition.

The chemical vapor deposition rate for the polycrystalline diamond membrane is generally in the range of approximately 0.05 to 0.5 microns/hr. and maintained for approximately 5 hours to 80 hours, preferably less than 40 hours. It has been found that the use of deposition times greater than 40 hours will result in diamond membranes with slightly rough surface topography with reduced optical transparency.

Finally, during both the pre-heating and chemical vapor deposition steps of the preferred method, the substrate is rotated at approximately 1 to 10 revolutions per hour, preferably at 2 to 5 revolutions per hour.

After a suitable period of polycrystalline diamond deposition time, the flow of the reactive gaseous mixture is stopped and an inert gas, i.e. argon, helium and the like, is passed over the coated substrate while the filament remains electrically charged for a period of time to purge the activated gaseous mixture from the reactor and then the coated substrate is cooled by removing the charge from the filament while continuing to pass the inert gas over the substrate.

FIG. 1A is a simplified sectional view of the HFCVD reactor that can be used to chemically vapor depositing a diamond membrane onto a substrate according to the present invention. The key elements of such an HFCVD reactor comprise the vertically positioned filament network 20, the vertically positioned, rotatable substrate support 21 are oriented within the reactor so that their surfaces are parallel to the axis of gas flow through the reaction zone 100. They are also oriented to be in the direction parallel to the gravitational forces.

The substrate 22 to be coated is supported by support means 21 as shown in FIG. 1B. The support means 21 comprises a disk shaped base plate 23 and a retainer ring 24 designed and configure to support a large (e.g. 4 in.) diameter substrate 22. In a preferred embodiment, the base plate 23 and the retainer ring 24 are made of a molybdenum or tantalum metal to avoid the formation of graphic soot during the CVD process. A pyrolytic graphite plate 25 approximately ⅛ inch thick is also provided and placed behind the substrate 22 to evenly distribute heat over the entire surface of the substrate 22.

The base plate 23, pyrolytic graphite plate 25, retainer ring 24, and the substrate 22 positioned therein, are mounted on a stainless steel support rod and plate 26 by conventional set screws 27. The substrate support rod 26 is supported by and positioned in the reactor by a flange 28 operatively secured to reactor port 29. The support rod can be moved in and out of the reactor to provide desired gap between the substrate and the filament network. To facilitate rotation of the substrate 22 during the CVD process, the support rod 26 is provided with a conventional gear system 30 attached to the external end of the substrate support rod 26 to engage gear 31 of an external motor 32. The substrate is initiated at a speed varying between 1 revolution per hour to 10 rph, preferably between 2 to 3 rph. The substrate support means 21 is also provided with a thermocouple 33 to measure the substrate temperature and a connecting electrical lead 34 through which the thermocouple output may be transmitted to an external indicator or read-out 35. The thermocouple touches the back side of the substrate, thereby measuring the substrate temperature from the behind.

Figure 1C:
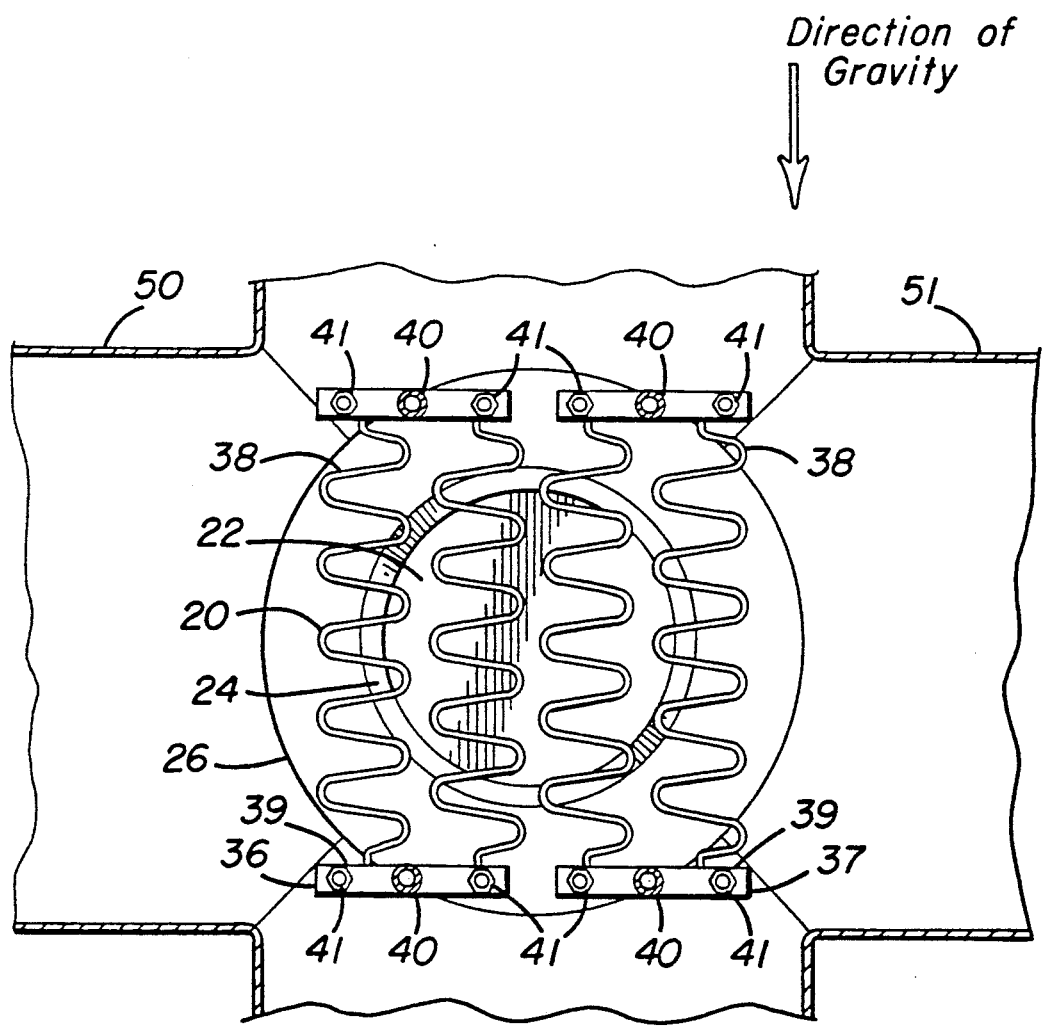

The filament network 20 illustrated in FIGS. 1A and 1C is designed and assembled in such a way that it provides a symmetrical and complete coverage to substrate surfaces of approximately 4 inches in diameter. It will be recognized by those skilled in the art that the filament network 20 may be designed and configured to accommodate various diameter substrates. In the preferred type of HFCVD reactor for the preparation of diamond membranes for X-ray lithography, the filament network 20 comprises two sets of filaments 36 and 37, one mounted on the left side and the other on the right side of the substrate 22, as shown in FIG. 1C. These filament sets 36, 37 are made of two 1.0 mm diameter and 33cm. long tantalum wires 38, each prebent in a serpentine fashion. The wires 38 were mounted on two sets of parallel tantalum bars 39 and secured to four copper feed-through 40 by conventional metal screws 41. The copper feed-through 40 are securely mounted to a disk shaped reactor support flange 42 operatively secured to reactor port 43 opposite to the one used for supporting the substrate support means 21. The copper feed-through 40 are isolated from the support flange 42 by means of four ceramic spacers 44. The filament networks 36 and 37 are provided with electrical leads 45 and 46 to which an appropriate electrical heating current is conducted form two independent AC power supplies 47 and 48.

The reactor shown in FIG. 1A is a six-way cross enclosed by a heat proof external wall 49 of quartz, stainless steel or other suitable material. The end ports 29, 43, 50, 51, 52 and 53 of the reactor are enclosed by removable port flanges 28, 42, 54, 55, 56 and 57 which isolate the reactor such that the interior can be evacuated without significant inward leakage from the surrounding ambient atmosphere. As previously discussed, reactor flanges 28 and 42 also support and position the substrate support means 21 and the filament copper feed-through 40, respectively. A four-way cross can alternatively be used as a heat proof external wall. Additionally, a heat proof chamber fitted with openings for gas inlet, outlet, filament network and substrate holder can also be used. The chamber can be cylindrical, rectangular, and spherical.

The top port 52 of the six way cross reactor is used to introduce the reactant gas into the reaction zone 100. One of the key elements of the reactor system consists of a gas dispersion device to provide substantially flat velocity profile in the reaction chamber. The introduction of feed gas in this way reduces or eliminates temperature gradient in the reactor and helps in improving life of the filament network. In the preferred embodiment, an approximately six inch long column 60 packed with glass or ceramic beads 61 is placed at the entrance port 52 to feed the reactant gas into the reaction zone 100 with a substantially flat velocity profile.

In order to regulate the gas pressure within the reactor chamber and remove the reaction product gases, the bottom port 53 of the reactor is provided with an opening (not shown) therein which an exhaust port tube 62 (schematically illustrated in FIG. 1B) is suitable connected to a vacuum pump 63. A vacuum gauge 64 is connected in the line thereto for indicating the pressure within the reactor chamber. By properly operating vacuum pump 63, the gas pressure within the reactor chamber may be regulated as desired.

The two side ports 50 and 51 of the reactor may also be used to mount sight glass(es) and/or a mass spectrometer probe. During the experimental analysis of the present invention (as set forth herein), a sight glass was used to observe the filament network 20 and substrate 22 during the CVD reaction. A dual wavelength pyrometer 65 was also employed to further monitor the filament 20 temperature.

A particular advantage of the structure and method of the present invention lies in the fact that the polycrystalline diamond membrane is chemically vapor deposited on the substrate such that the polycrystalline diamond membrane is continuous, substantially compressive stress free, pin-holes and defects free, and exhibits a wrinkle-free topography.

Figure 3:
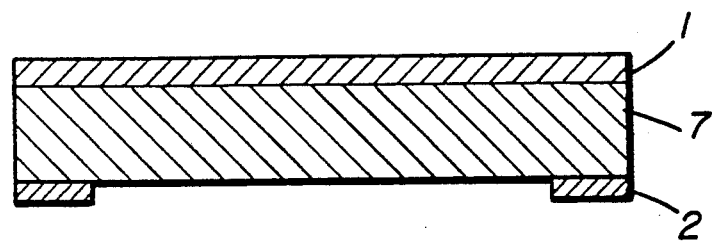
Figure 4:
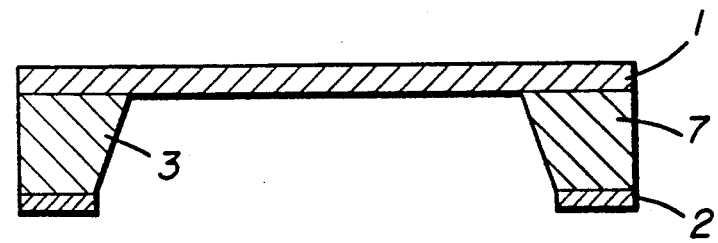

To fabricate the X-ray lithography mask in accordance with this invention, following deposition of the diamond membrane 1 onto the substrate 7 and removal of the coated substrate 7 from the reactor, (FIGS. 2, 3) an etch resistant mask 2 is applied to the back surface of the coated substrate 7 to define one or more openings (FIG. 3). The back side is then etched through the mask by preferential chemical etchant until a window 3 is formed (FIG. 4). An X-ray absorbing pattern 4 comprising gold, nickel, tungsten, tantalum, titanium, or other suitable material or their combination is then deposited on top of the diamond membrane 1 (FIG. 5), after which the specified pattern is left by the selective etching. For convenience, etch resistant mask 2 is shown to have been removed at this point during the developing step. It could be removed instead either earlier or later or not at all, if desired.

The examples which follow illustrate the method of the invention and of the polycrystalline diamond membranes produced thereby. The examples are for illustrative purposes only and are not meant to limit the scope of the claims in any way.

PRE-TREATMENT OF A NEW FILAMENT

Figure 6:
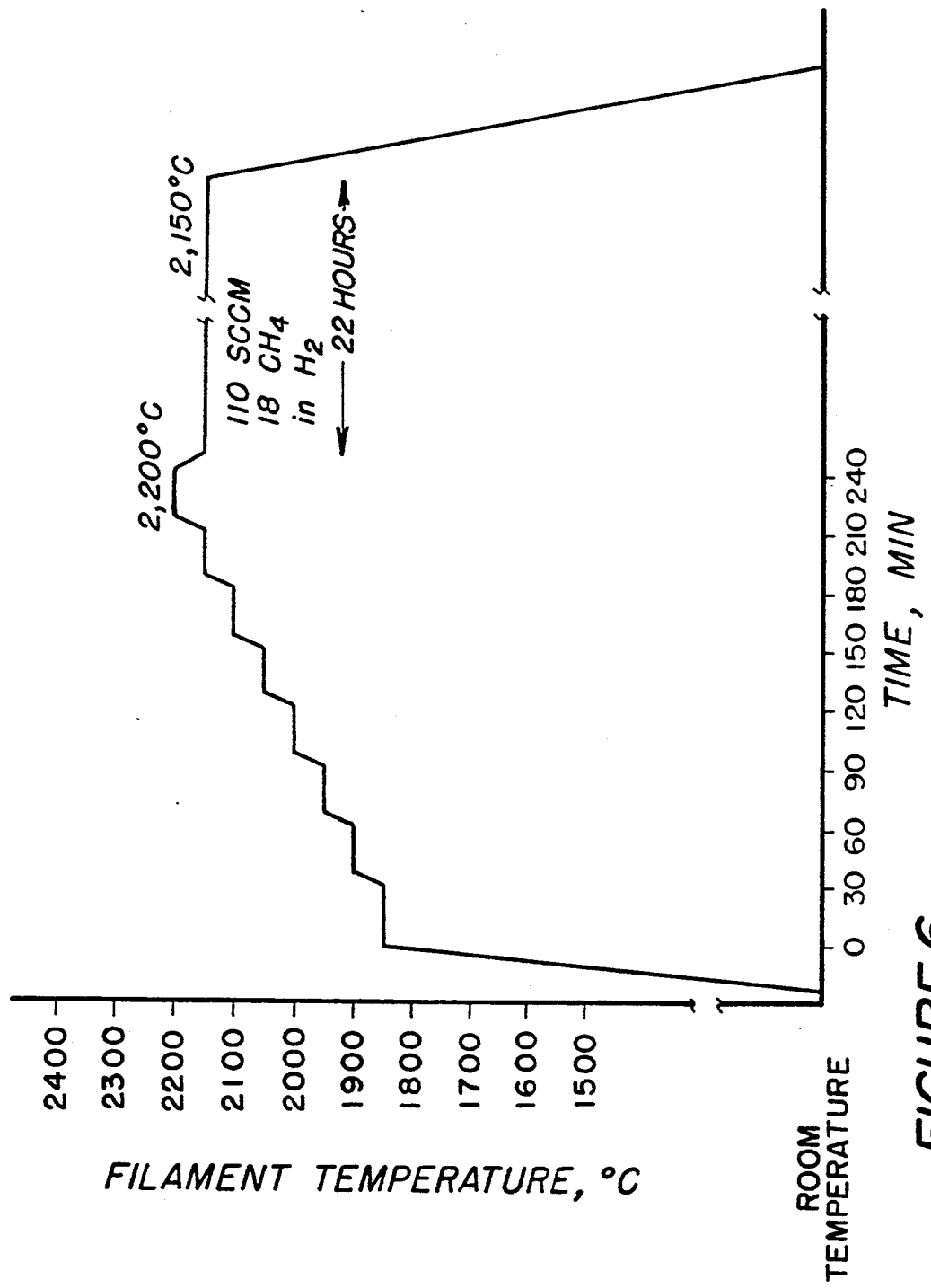
FIG. 6 is a graph illustrating the time-temperature sequence for pre-treatment of a new filament network used in the present invention.

The preferred filament network of used in the present invention was assembled with 1.0 mm diameter tantalum wire and positioned in the center of the ~6" diameter six-way cross HFCVD reactor. The total length of the filament wire used was 132 cm with an effective surface area of 41.4 cm$^2$. A 4" silicon wafer was decreased and mounted on the holder similar to the one described in detail earlier. The distance between the network and the silicon wafer was ~15 mm. The network was heated rapidly to ~1850° C. in the presence of ~220 sccm flow of 1% $CH_4$ in $H_2$ and 30 torr to condition and carburized. This flow rate provide a carbon in the feed gas to filament surface area ratio of $2.8 \times 10^{-5}$ g/cm$^2$ min. It was pre-treated using the time-temperature sequence shown in FIG. 6. The maximum filament temperature was limited to ~2,200° C. It was maintained for 30 min., thereafter the temperature wad reduced to ~2,150° C. The flow rate of 1% $CH_4$ in $H_2$ was reduced to ~110 sccm. This flow rate and and ~2,150° C. filament temperature were maintained for 22 hours. The network was then cooled under flowing helium gas.

The surface of the filament was carburized well, as evidenced by gold color of TaC. No signs of filament bending were noted during and after carburization. Additionally, no signs of graphitic carbon deposit were seen on the filament.

The filament carburization procedure described above was used prior to using a new filament for depositing thin polycrystalline diamond membrane an the substrates in all the examples described below. In some of the examples a used tantalum filament (filament used previously in depositing PCD films in one or more experiments) was utilized for depositing diamond membranes. In no case was a virgin tantalum filament was used for depositing polycrystalline diamond membranes.

EXAMPLES

EXAMPLE 1

A 4" diameter silicon wafer was placed in a an HFCVD reactor as described above. The wafer was pre-etched for one hour in an ultrasonic bath using a slurry of 30–35 μm diamond powder in ethanol. A distance of ~13 mm was maintained between the wafer and filament network. The filament network was pre-treated or pre-carburized using the procedure described in the pre-treatment of a new filament section. The wafer was heated to ~650° C. (determined by placing a thermocouple behind the wafer touching its back surface) under flowing He for ½ hour by energizing the filament network with an A.C. power supply. After ½ hour the flow of He was stopped and a flow of 45 sccm of 1% $CH_4$ in $H_2$ was initiated. The wafer temperature was increased slowly to ~680° C. to begin depositing diamond. The average temperature of filament network made of 1 mm diameter tantalum wires was ~2,060° C. during diamond deposition. The silicon wafer was rotated at ~5 revolutions per hour during diamond deposition, which was continued for 18 hours. After this time, the flow of feed gas was switched from 45 sccm of 1% $CH_4$ in $H_2$ to ~50 sccm of He. The filament power was turned off after ½ hour and the diamond coated wafer was cooled under flowing He gas.

The wafer was deposited with ~2 μm thick, adherent, coherent, and continuous film. The film was smooth and had a reflective surface finish. It was free of pin-holes. Furthermore, it showed excellent electrical resistivity, which was determined by a hand held ohmmeter.

The uncoated side of the wafer was masked with wax, exposing a two-inch diameter area in the middle of the wafer. This exposed area was etched with a mixture of $HF/HNO_3$ acid to remove silicon as well as to expose thin diamond membrane. The wax was then removed by dissolving it in an organic solvent. The thin polycrystalline diamond membrane was free of compressive stresses, as indicated by the absence of wrinkles. It was optically transparent, and showed no signs of defects. The polycrystalline diamond membrane has smooth and reflective surface finish on both sides. The thin diamond membrane was >99% transparent to 2Å wavelength X-rays. The transparency of this membrane was >60% to 10Å wavelength X-rays. The X-ray transparency of diamond membrane was determined to be higher than 2.5 μm thick Mylar, which is a known X-ray transparent material. This example therefore showed that a thin polycrystalline diamond X-ray membrane could be produced by HFCVD technique.

EXAMPLE 2

The diamond deposition experiment described in Example 1 was repeated using a similar reactor, type and size of silicon wafer, surface preparation technique, pre-treated or pre-carburized filament network and deposition conditions and procedure.

The wafer was deposited with ~2 μm thick, adherent, coherent, continuous and pin-hole free polycrystalline diamond film. The film was smooth and had a reflective surface finish. The wafer was sectioned into four pieces. These pieces were masked and etched to prepare ½ inch diameter membranes. These membranes were free of compressive stresses, as indicated by the absence of wrinkles. They had smooth and reflective surface finish on both sides. They were also optically transparent—transparency at 600 and 800 nanometer wavelengths was >60 and >70%, respectively. They were >99% transparent to 2Å wavelength X-rays.

Their transparency was ~70% to 10Å wavelength X-rays. This example therefore showed that a thin polycrystalline diamond X-ray membranes with excellent optical and X-ray transparencies could be produced by HFCVD technique.

EXAMPLE 3A

The diamond deposition experiment described in Example 1 was repeated using a similar reactor, type and size of silicon wafer, deposition procedure, pre-treated or pre-carburized filament network, and filament network and wafer temperatures except for ~14 mm filament network to wafer distance and 25 sccm flow of 1% $CH_4$ in $H_2$ during diamond deposition (see Table 1). The wafer was pre-etched with a slurry of 20–25 μm diamond powder in ethanol in an ultrasonic bath for one hour.

The wafer was deposited with 1–2 μm thick, uniform, adherent, coherent, continuous and pin-hole free diamond film. The film was smooth and had a reflective surface finish.

A two-inch diameter diamond membrane was etched in the middle of the wafer following the procedure described in Example 1. The membrane was free of compressive stresses, as indicated by the absence of wrinkles. It was optically transparent, and showed no signs of defects. The optical transparency of membrane was better than membranes of Example 2. The membrane had smooth and reflective surface finish on both sides. This example thus showed that a thin polycrystalline diamond membrane could be produced by HFCVD using 25 sccm flow of 1% $CH_4$ in $H_2$, ~14 mm filament network to wafer distance and 680° C. wafer temperature.

EXAMPLE 3B

The diamond deposition experiment described in Example 3A was repeated using a similar reactor, type and size of silicon wafer, deposition procedure, pre-treated or pre-carburized filament network and filament and wafer temperatures except for ~12 mm filament network to wafer distance and 45 sccm of 1% $CH_4$ in $H_2$ during diamond deposition (see Table 1). The wafer was pre-etched with a slurry of 30-35 μm diamond powder in ethanol in an ultrasonic bath for 1 hour.

The wafer was deposited with 1-2 μm thick, uniform, adherent, coherent, continuous and pin-hole free polycrystalline diamond film. The film was smooth and had a reflective surface finish.

A two-inch diameter diamond membrane was etched in the middle of the wafer following the procedure described in Example 1. The membrane was free of compressive stresses. It was optically transparent and had smooth and reflective surface finish on both sides.

This example showed that a thin polycrystalline diamond membrane could be produced by HFCVD using 45 sccm of 1% $CH_4$ in $H_2$, ~12 mm filament network to wafer distance and 680° C. wafer temperature.

EXAMPLE 3C

The diamond deposition experiment described in Example 3B was repeated using a similar reactor, type and size of silicon wafer, deposition procedure, pre-treated or pre-carburized filament network, filament and wafer temperatures, and flow rate of feed gas except for using ~13 mm filament network to wafer distance (see Table 1). The wafer was pre-etched with a slurry of 30-35 μm diamond powder in ethanol in an ultrasonic bath for 2 hours.

The wafer was deposited with 1-2 μm thick, uniform, adherent, coherent, continuous and pin-hole free polycrystalline diamond film. The film was smooth and had a reflective surface finish.

A two-inch diameter diamond membrane was etched in the middle of the wafer following the procedure described in Example 1. The membrane was free of compressive stresses. It was optically transparent and had smooth and reflective surface finish on both sides.

This example showed that a thin diamond membrane could be produced by HFCVD using 45 sccm of 1% $CH_4$ in $H_2$, ~13 mm filament network to wafer distance, and 680° C. wafer temperature.

EXAMPLE 3D

The diamond deposition experiment described in Example 3A was repeated using the identical reactor, procedure, conditions, and pre-carburized filament network except for using 455 sccm flow rate of 1% $CH_4$ in $H_2$ instead of 25 sccm (see Table 1).

The wafer was deposited with 1-2 μm thick, uniform, adherent, coherent, continuous and pin-hole free polycrystalline diamond film. The diamond membrane (two-inch diameter) again was free of compressive stresses. It was optically transparent and had smooth and reflective surface finish in both sides.

This example showed that a thin diamond membrane could be produced by HFCVD using 45 sccm of 1% $CH_4$ in $H_2$, ~14 mm filament network to wafer distance, and 680° C. wafer temperature.

EXAMPLE 3E

The diamond deposition experiment described in Example 3A was repeated using a similar reactor, type and size of silicon wafer, deposition procedure, pre-carburized filament network, and filament network and wafer temperatures except for ~13 mm filament network to wafer distance and 88 sccm flow of 1% $CH_4$ in $H_2$ (see Table 1).

The wafer was deposited with 1-2 μm thick, uniform, adherent, coherent, continuous and pin-hole free polycrystalline diamond film. The diamond membrane (two-inch diameter) was once again free of compressive stresses. It was optically transparent and had smooth and reflective surface finish on both sides.

This example showed that a thin diamond membrane could be produced by HFCVD using 88 sccm of 1% $CH_4$ in $H_2$, ~13 mm filament network to wafer distance and 680° C. wafer temperature.

EXAMPLE 3F

The diamond deposition experiment described in Example 3E was repeated using the identical reactor, procedure, and conditions except for 440 sccm flow of 1% $CH_4$ in $H_2$ (see Table 1).

The wafer was deposited with 1-2 μm thick, uniform, adherent, coherent, continuous and pin-hole free polycrystalline diamond film. The diamond membrane (two-inch diameter) was free of compressive stresses. It was optically transparent and had smooth and reflective surface finish on both sides.

This example showed that a thin diamond membrane could be produced by HFCVD using 440 sccm of 1% $CH_4$ in $H_2$, ~13 mm filament network to wafer distance and 680° C. wafer temperature.

EXAMPLE 3G

The diamond deposition experiment described in Example 3E was repeated using the identical reactor, procedure, and conditions except for 550 sccm flow of 1% $CH_4$ in $H_2$ (see Table 1).

The wafer was deposited with 1-2 μm thick, uniform, adherent, coherent, continuous and pin-hole free polycrystalline diamond film. The diamond membrane (two-inch diameter) was free of compressive stresses. It was optically transparent and had smooth and reflective surface finish on both sides.

This example showed that a thin diamond membrane could be produced by HFCVD using 550 sccm of 1% $CH_4$ in $H_2$, ~13 mm filament network to wafer distance and 680° C. wafer temperature.

EXAMPLE 3H

The diamond deposition experiment described in Example 3E was repeated using the identical reactor, and deposition procedure and conditions except for 605 sccm of 1% $CH_4$ in $H_2$ (see Table 1).

The wafer was deposited with 1-2 μm thick, uniform, adherent, coherent, continuous and pin-hole free polycrystalline diamond film. The diamond membrane (two-inch diameter) however was under compressive stresses, as evidenced by the presence of wrinkles. It was optically transparent and had smooth and reflective surface finish on both sides.

This example showed that a thin diamond membrane for X-ray lithography could not be produced by HFCVD using 605 sccm of 1% $CH_4$ in $H_2$, ~13 mm filament network to wafer distance, and 680° C. wafer temperature.

EXAMPLE 3I

The diamond deposition experiment described in Example 3E was repeated using the identical reactor, procedure, and conditions except for 660 sccm of 1% $CH_4$ in $H_2$ (see Table 1).

The wafer was deposited with 1-2 μm thick, uniform, adherent, coherent, continuous and pin-hole free polycrystalline diamond film. The diamond membrane (two-inch diameter) however was under compressive stresses, as evidenced by the presence of wrinkles. It was optically transparent and had smooth and reflective surface finish on both sides.

This example showed that a thin diamond membrane for X-ray lithography could not be produced by HFCVD using ≧605 sccm of 1% $CH_4$ in $H_2$, ~13 mm filament network to wafer distance, and 680° C. wafer temperature.

EXAMPLE 3J

The diamond deposition experiment described in Example 3A was repeated using a similar reactor, deposition procedure, and filament network and wafer temperatures, pre-carburized filament network except for 3" diameter wafer, 45 sccm of 1% $CH_4$ in $H_2$, and ~13 mm filament network to wafer distance (see Table 1).

The wafer was deposited with 1~2 μm thick, uniform, adherent, coherent, continuous and pin-hole free polycrystalline diamond film. The diamond membrane (two-inch diameter) was free of compressive stresses. It was optically transparent and had smooth and reflective surface finish on both sides.

This example showed that a thin diamond membrane could be produced by HFCVD on 3" diameter silicon wafer.

EXAMPLE 4A

The diamond deposition experiment described in Example 1 was repeated using a similar reactor, type and size of silicon wafer, and deposition procedure except for ~9 mm filament network to wafer distance, 88 sccm flow of 1% $CH_4$ in $H_2$, and ~660° C. wafer temperature (see Table 2). The wafer was pre-etched with a slurry of 30-35 μm diamond powder in ethanol in an ultrasonic bath for two hours.

The wafer was deposited with 1-2 μm thick, uniform, adherent, coherent, continuous and pin-hole free polycrystalline diamond film. The film had a slightly dull surface finish.

A one-inch diameter diamond membrane was etched in the middle of the wafer following the procedure described in Example 1. The membrane was found to be under compressive stresses, as evidenced by the presence of wrinkles. It was however optically transparent.

Scanning electron micrograph of PCD film revealed it to contain coarse-grained, marginally oriented crystals. The average crystal size appeared to be ~0.5 μm. It also appeared to have a fine cubic surface morphology. The x-ray diffraction scan confirmed that the diamond crystals in the film are preferentially oriented in the (220) direction (see Table 4). The crystallite size varied from 260 to 590 Å. This information indicated that thin diamond films with crystals oriented in (220) direction are not desirable for x-ray lithography membrane application.

This example showed that a thin diamond membrane for X-ray lithography could not be produced by HFCVD using ~9 mm filament network to wafer distance.

EXAMPLE 4B

The diamond deposition experiment described in Example 4A was repeated using the identical reactor, type and size of silicon wafer, surface preparation technique, and deposition procedure and conditions except for ~740° C. wafer temperature, as shown in Table 2.

The wafer was deposited with 1-2 μm thick, uniform, adherent, coherent, continuous and pin-hole free polycrystalline diamond film. The film had a slightly dull surface finish. the diamond membrane (one-inch diameter) however was under compressive stresses.

This example showed that a thin diamond membrane for X-ray lithography could not be produced by HFCVD using ~9 mm filament network to wafer distance and 740° C. substrate temperature.

EXAMPLE 4C

The diamond deposition experiment described in Example 4A was repeated using the identical reactor, type and size of silicon wafer, surface preparation technique, and deposition procedure and conditions except for ~700° C. wafer temperature and 132 sccm flow of 1% $CH_4$ in $H_2$ (see Table 2).

The wafer was deposited with ~2 μm thick, uniform, adherent, coherent, continuous and pin-hole free polycrystalline diamond film. The film had a dull surface finish. The diamond membrane (one-inch diameter) however was under compressive stresses. Additionally, it had a poor optical transparency.

This example showed that a thin diamond membrane for X-ray lithography could not be produced by HFCVD using ~9 mm filament network to wafer distance.

EXAMPLE 5A

The diamond deposition experiment described in Example 1 was repeated using a similar reactor, type and size of silicon wafer, surface preparation procedure, and deposition procedure and conditions except for ~11 mm filament network to wafer distance, 45 sccm flow of 1% $CH_4$ in $H_2$ and ~660° C. substrate temperature (see Table 2).

The wafer was deposited with ~1 μm thick, uniform, adherent, coherent, continuous and pin-hole free polycrystalline diamond film. The film had a smooth and reflective surface finish.

A one-inch diameter diamond membrane was etched in the middle of the wafer following the procedure described in Example 1. The membrane was found to be under compressive stresses, as evidenced by the presence of wrinkles. It was however optically transparent.

This example showed that a thin diamond membrane for X-ray lithography could not be produced by HFCVD using ~660° C. temperature and 11 mm substrate to filament network distance.

EXAMPLE 5B

The diamond deposition experiment described in Example 5A was repeated using the identical reactor, type and size of silicon wafer, surface preparation technique, and deposition procedure and conditions except for 132 sccm flow of 1% $CH_4$ in $H_2$ (s ® ®Table 2).

The wafer was deposited with 1-2 $\mu$m thick, uniform, adherent, coherent, continuous and pin-hole free polycrystalline diamond film. The film had a smooth surface finish. The diamond membrane (one-inch diameter) however was under compressive stresses.

This example showed that a thin diamond membrane for X-ray lithography could not be produced by HFCVD using ~660° C. wafer temperature and 11 mm substrate to filament network distance.

EXAMPLE 5C

The diamond deposition experiment described in Example 5A was repeated using the identical reactor, type and size of silicon wafer, surface preparation technique, and deposition procedure and conditions except for 88 sccm flow of 1% $CH_4$ in $H_2$ and ~13 mm filament network to wafer distance.

The wafer was deposited with 1-2 $\mu$m thick, uniform, adherent, coherent, continuous and pin-hole free polycrystalline diamond film. The film had a dull surface finish. The diamond membrane (one-inch diameter) however was under compressive stresses.

This example showed that a thin diamond membrane for X-ray lithography could not be produced by HFCVD using ~660° C. wafer temperature and 13 mm filament network to wafer distance.

EXAMPLE 5D

The diamond deposition experiment described in Example 5A was repeated using the identical reactor, type and size of silicon wafer, surface preoperative technique, and deposition procedure and conditions except for ~740° C. wafer temperature, as shown in Table 2.

The wafer was deposited with 1-2 $\mu$m thick, uniform, adherent, coherent, continuous and pin-hole free polycrystalline diamond film. The film had a smooth surface finish. The diamond membrane (one-inch diameter) however was under compressive stresses.

This example showed that a thin diamond membrane for X-ray lithography could not be produced by HFCVD using ~740° C. wafer temperature and 11 mm filament network to wafer distance.

EXAMPLE 5E

The diamond deposition experiment described in Example 5D was repeated using the identical set-up, procedure, and condition except for 132 sccm flow of 1% $CH_4$ in $H_2$ (see Table 2).

The wafer was deposited with 1-2 $\mu$m thick, uniform, adherent, coherent, continuous and pin-hole free polycrystalline diamond film. The diamond membrane (one-inch diameter) however was under compressive stresses.

Scanning electron micrograph of PCD fiber revealed it to contain coarse-grained, marginally oriented diamond crystals. The average crystal size appeared to be ~1.0 $\mu$m. It had a plate-like surface finish. The x-ray diffraction scan confirmed that the diamond crystals are preferentially oriented in the (311) and (400) directions, as shown in Table 4. The crystallite size of this film varied between 380 Å and 900 Å, indicating it to be larger than film of Example 4A. This information indicated that thin diamond films with crystals oriented in (311) and (400) directions are not desirable for x-ray lithography membrane application.

This example showed that a thin diamond membrane for X-ray lithography could not be produced by HFCVD using ~740° C. wafer temperature and 11 mm filament network to wafer distance.

EXAMPLE 5F

The diamond deposition experiment described in Example 5D was repeated using identical set-up, procedure, and conditions except for 88 sccm flow of 1% $CH_4$ in $H_2$ and ~13 mm filament network to wafer distance (see Table 2).

The wafer was deposited with 1-2 $\mu$m thick, uniform, adherent, coherent, continuous and pin-hole free polycrystalline diamond film. The diamond membrane (one-inch diameter) however was under compressive stresses.

This example showed that a thin diamond membrane for X-ray lithography could not be produced by HFCVD using ~740° C. wafer temperature and 13 mm filament network to wafer distance.

EXAMPLE 5G

The diamond deposition experiment described in Example 5D was repeated using the identical set-up, procedure, and conditions except for ~700° C. filament temperature (see Table 2).

The wafer was deposited with 1-2 $\mu$m thick, uniform, adherent, coherent, continuous and pin-hole free polycrystalline diamond film. The diamond membrane (one-inch diameter) was free of compressive stresses. It was also optically transparent, but the transparency was slightly worse than that noted in Example 2.

This example showed that a thin diamond membrane for X-ray lithography could be produced by HFCVD using ~700° C. wafer temperature and 11 mm filament network to wafer distance.

EXAMPLE 5H

The diamond deposition experiment described in Example 5G was repeated using the identical set-up, procedure, and conditions except for ~13 mm filament network to wafer distance (see Table 2).

The wafer was deposited with 1-2 $\mu$m thick, uniform, adherent, coherent, continuous and pin-hole free polycrystalline diamond film. The diamond membrane (one-inch diameter) was optically transparent (same as Example 5G) and free of compressive stresses.

This example once again showed that a thin diamond membrane for X-ray lithography could be produced by HFCVD using ~700° C. wafer temperature and 13 mm filament network to wafer distance.

EXAMPLE 5I

The diamond deposition experiment described in Example 5H was repeated using the identical set-up, procedure, and conditions except for 88 sccm flow of 1% $CH_4$ in $H_2$ (see Table 2).

The wafer was deposited with 1-2 $\mu$m thick, uniform, adherent, coherent, continuous and pin-hole free polycrystalline diamond film. The diamond membrane (one-inch diameter) was optically transparent (same as Example 5G) and free of compressive stresses.

This example showed that a thin diamond membrane for X-ray lithography could be produced by HFCVD using ~700° C. wafer temperature and 13 mm filament network to wafer distant.

EXAMPLE 5J

The diamond deposition experiment described in Example 5I was repeated with 132 sccm flow of 1% $CH_4$ in $H_2$ (see Table 2).

The wafer was deposited with 1-2 µm thick, uniform, adherent, coherent, continuous and pin-hole free polycrystalline diamond film. The diamond membrane (one-inch diameter) was optically transparent (same as Example 5G) and free of compressive stresses.

Scanning electron micrograph of PCD film revealed it to contain fine-grained, randomly oriented diamond crystals with average crystal size to be less than 0.3 µm. The film had smooth, mirror-like finish. X-ray diffraction scan confirmed that the crystals in this film were randomly oriented (see Table 4). The 15 average crystallite size varied from 300 Å to 430 Å, which was considerably lower than those observed in films of Examples 4A and 5E. This information indicated that thin diamond films with randomly oriented crystals and relatively small crystallite size are desirable for x-ray lithography membrane application.

This example showed that a thin diamond membrane for X-ray lithography could be produced by HFCVD using ~700° C. wafer temperature and 13 mm filament network to wafer distance.

EXAMPLE 6A

A 4" diameter silicon wafer was placed in a HFCVD reactor as described in Example 1. The wafer was pre-etched for one hour in an ultrasonic bath using a slurry of 20-25 diamond powder in ethanol. A distance of ~14 mm was maintained between the wafer and filament network. The filament network was pre-carburized using the procedure described in the pre-treatment of a new filament section. The wafer was heated to ~650° C. under flowing He for ½ hour by energizing the filament network with an A.C. power supply. After ½ hour the flow of He was stopped and a flow of 45 sccm of 1% $CH_4$ in $H_2$ was initiated. The wafer temperature was increased slowly to 660° C. to begin depositing diamond using a cyclic process. It involved depositing diamond in two sets of two cycles carried out at two different temperatures. For example, the wafer was deposited with diamond for 5 hours at 660° C. using 45 sccm of 1% $CH_4$ in $H_2$. After 5 hours of polycrystalline diamond (PCD) deposition in the first cycle, the temperature was increased to 680° in about 10 minutes and maintained there to deposit PCD for another 5 hours, thereby providing 10 hours of deposition time for one set of two cycles. This set of two cycles was repeated by depositing PCD at 660° C. and 680° C. for 5 additional hours each to provide a total deposition time of 20 hours (see Table 3). The silicon wafer was rotated at ~5 revolutions per hour during PCD deposition. After completing two sets of two deposition cycles, the flow of feed gas was switched from 45 sccm of 1% $CH_4$ in $H_2$ to ~50 sccm of He. The filament power was turned off after ½ hour and the diamond coated wafer was cooled under flowing He gas.

The wafer was deposited with ~2 µm thick, adherent, coherent, continuous and pin-hole free polycrystalline diamond film. The film was smooth and had a reflective surface finish.

A two-inch diameter membrane was etched in the middle of the wafer following procedure described in Example 1. The membrane was free of compressive stresses, as indicated by the absence of wrinkles. It was optically transparent, and showed no signs of defects. The optical transparency of the membrane was similar to that noted in Example 2. The membrane had smooth and reflective surface finish on both sides.

This example showed that a thin diamond membrane could be produced by cycling deposition temperature between 660° and 680° C. in a HFCVD reactor.

EXAMPLE 6B

The diamond deposition experiment described in Example 6A was repeated using a similar reactor, type and size of silicon wafer, surface preparation technique, and deposition process and conditions except for 680° C. in the first cycle and 700° C. in the second cycle of two sets of two cycles. A deposition time of 5 hours was used in each cycle, thereby providing a total deposition time of 20 hours.

The wafer was deposited with ~2 µm thick, adherent, coherent, continuous and pin-hole free polycrystalline diamond film. The film has smooth and reflective surface finish.

A two-inch diameter membrane was etched in the middle of the wafer following the procedure described in Example 1. The membrane was free of compressive stresses, as indicated by absence of wrinkles. It was optically transparent and showed no signs of defect. The optical transparency of the membrane was similar to that noted in Example 2. The membrane had smooth and reflective surface finish on both sides.

This example showed that a thin diamond membrane could be produced by cycling deposition temperature between 680° and 700° C. in a HFCVD reactor.

X-RAY DIFFRACTION AND TRANSMISSION ANALYSIS

X-ray diffraction analyses were carried out using a Siemens D-500 Bragg-Brentano diffractometer equipped with a normal focus, 2000 W, Cu target X-ray tube operated at 40 kV and 35 mA, a curved graphite crystal monocromator, and a scintillation detector. Digitized data were collected and treated using a Siemens DACO-MP microprocessor and an IBM PC-AT computer equipped with Diffrac AT software. Both conventional theta/two-theta (theta coupled) and theta/two-theta (theta coupled and offset) scans were run using 1° slits with a 0.05° receiving slit and 0.02° step sizes. Typical counting times per step were 3-5 sec. In order to suppress the intense Si(400) reflection near 69.2°, the theta coupled and offset scans were run with a constant theta offset of −2.0°.

CID scans were run with the following order of slits: incident beam aperture (open), divergence slit (0.1°), sample, diffracted beam aperture (open), receiving slit (0.15°), and monochromator (0.15°). This slit arrangement gave an incident beam of limited divergence at small incident beam angles which was completely intercepted by the sample and which yielded reasonable intensities. In the CID scans the sample was fixed at a small angle to the incident beam while the detector was scanned through two-theta. Optimum results were obtained by using grazing incident beam angels of 2° and 1°. At incident angles greater than 2°, substrate penetration by the beam was significant. On the other hand, at less than 1° incident beam angles instrument alignment was critical and peak smearing became pronounced. The Soller slit in the diffracted beam was used as designed by the instrument manufacturer, i.e., the slit blades were in the vertical plane relative to the sample surface in the horizontal plane when the detector was at zero. No attempt was made to convert the Soller slit to parallel beam optics. Typical CID scans were done using 0.02 steps and 8–12 sec. per step.

Crystallite sizes in the PCD films were calculated from the Scherrer equation $$D = \frac{(0.9) \lambda}{(B_1 - B_0) \cos \theta}$$

where D is the volume average of the crystallite dimension in a direction normal to the diffracting planes, 0.9 is the crystallite shape factor, $\lambda$ is the wavelength, $B_1$ is the full width at half-maximum (FWHM) peak height in radians of the peak being measured, $B_0$ is the instrumental broadening correction to the FWHM in radians, and $\Theta$ is half the diffraction angle. $B_0$ was determined using a highly crystalline corundum plate analyzed under the same conditions. FWHM measurements were done on $K\alpha_1$ peaks after stripping the $K\alpha_2$ contribution. Crystallite size calculations presumed that all line broadening was due to size effects rather than to the presence of crystallite strain or crystal defects.

The x-ray transmission properties of a free-standing diamond film were determined by using an EDAX PV 9100/70 Energy Dispersive X-ray Fluorescence spectrometer equipped with a direct excitation Rh target X-ray tube and a Si(Li) detector fitted with a nominal 7 $\mu$m thick beryllium window. A collar was designed and machined out of plexiglass to mount free-standing diamond receiving shaft of the detector for determining transmission properties. A reference pellet containing approximately 19% Na, 7% Al, 8% Si, 2% Ca, and 1.7% Fe was prepared from inorganic salts and oxides and used to generate spectra of short and long wavelengths with a Rh x-ray tube operated at 15 kV and 150 $\mu$amps, no incident beam filter, vacuum, and 900 sec. live counting time. Intensities for each peak, including the Rh target L line, were ratioed to the Fe K-alpha peak reference pellet analyzed without the presence of a film in front of the detector. Percent transmissions were calculated from these ratios by using the following equation $$\text{Percent Transmission} = \frac{I}{I^o} \times 100$$

where I and $I_o$ are intensity transmitted with and without the presence of diamond film.

SUMMARY OF EXAMPLES

Examples 3A to 3G and 3J thus show that thin diamond membranes with excellent optical and X-ray transmittance properties can be produced by using filament network to wafer distance varying from 12 to 14 mm, wafer temperature of ~680° C., and the flow rate of 1% $CH_4$ in $H_2$ less than 605 sccm. These examples also show that thin diamond membranes can be produced by depositing diamond films on 3" and 4" diameter silicon wafers and etching the silicon support.

Examples 4A to 4C show the effects of deposition temperature and filament network to wafer distance upon the quality of a diamond membrane. The data clearly show that a filament network to wafer distance of ~9 mm is not desirable for producing diamond membranes for X-ray lithography application.

Examples 5A to 5J show that thin diamond membranes for X-ray lithography cannot be produced by using wafer temperatures $\leq$660° C. and $\geq$740° C. They can however be produced by using a temperature between 660° C. and 740° C. This is an important and significant finding. These examples also show that the optical transparency of diamond membranes (Examples 5G to 5J) decrease slightly with an increase in the deposition temperature. The optical transparency of these membranes however can be improved by enduring the thickness by polishing or ion beam milling the diamond film.

Examples 4A, 5E and 5F showed that PCD films with randomly oriented crystals and large crystallite size (>500 Å) are not suitable for x-ray lithography membrane applications. They also showed that it would be desirable to deposit PCD film with randomly oriented crystals and small crystallite size for x-ray lithography application.

Examples 6A and 6B show that a combination of low and high deposition temperatures can be used to produce thin PCD membranes for X-ray lithography provided the temperatures are between 660° C. and 740° C. and the filament network to wafer distance is greater than 9 mm.

One skilled in the art would recognize that additional analytic techniques can be used to characterize the structure and composition of diamond membranes. X-ray diffraction is one example of the techniques and is very useful for determining the size and geometric orientation of the individual diamond crystals composing the membrane. A combination of crystal size and orientation may relate directly to the stress state of the resulting membrane.

From the foregoing description, one of ordinary skill in the art can easily ascertain that the present invention provides a novel method for producing a substantially compressive stress free diamond membrane for X-ray lithography. A highly important technical advantage of the invention is that pattern distortion and/or damage is virtually eliminated during X-ray lithography.

Without departing from the spirit and scope of this invention, one of ordinary skill can make various changes and modifications to the invention to adapt it to various usages and conditions. As such, these changes and modifications are properly, equitably, and intended to be, within the full range of equivalents of the following claims.

TABLE 1

| Example | 3A | 3B | 3C | 3D | 3E | 3F | 3G | 3H | 3I | 3J |
|---|---|---|---|---|---|---|---|---|---|---|
| Experiment No. | 199 | 195 | 165 | 216 | 167 | 204 | 206 | 207 | 208 | 210 |
| Silicon Wafer | 4" Dia. | 4" Dia. | 4" Dia. | 4" Dia. | 4" Dia. | 4" Dia. | 4" Dia. | 4" Dia. | 4" Dia. | 4" Dia. |
| Filament to Wafer Distance, mm | ~14 | ~12 | ~13 | ~14 | ~13 | ~13 | ~13 | ~13 | ~13 | ~13 |
| Wafer Temp. °C. | ~680 | ~680 | ~680 | ~680 | ~680 | ~680 | ~680 | ~680 | ~680 | ~680 |
| Ave. Filament Network Temp. | ~2070 | ~2060 | ~2040 | ~2070 | ~2030 | ~2050 | ~2030 | ~2060 | ~2000 | ~2000 |

TABLE 1-continued

| Example | 3A | 3B | 3C | 3D | 3E | 3F | 3G | 3H | 3I | 3J |
|---|---|---|---|---|---|---|---|---|---|---|
| Flow Rate of 1% CH4 in H2, sccm | 25 | 45 | 45 | 45 | 88 | 440 | 550 | 605 | 660 | 45 |
| Total Pressure Torr | 30 | 30 | 30 | 30 | 30 | 30 | 30 | 30 | 30 | 30 |
| Deposition Time, Hrs. | 18 | 18 | 18 | 18 | 18 | 18 | 18 | 18 | 18 | 18 |
| PCD Film Thickness, μm | 1-2 | 1-2 | 1-2 | 1-2 | 1-2 | 1-2 | 1-2 | 1-2 | 1-2 | 1-2 |
| Surface Finish of PCD Film | 1* | 1* | 1* | 1* | 1* | 1* | 1* | 1* | 1* | 1* |
| PCD Membrane Quality | 2* | 2* | 2* | 2* | 2* | 2* | 2* | 3* | 3* | 2* |

Note: Wafer was rotated at ~5 revolutions per hour.
1* Smooth and shiny
2* Excellent, free of compressive stresses, and optically transparent
3* Film under compressive stresses but optically transparent

TABLE 2

| Example | 4A | 4B | 4C | 5A | 5B | 5C | 5D | 5E | 5F | 5G | 5H | 5I | 5J |
|---|---|---|---|---|---|---|---|---|---|---|---|---|---|
| Experiment No. | 143 | 144 | 142 | 133 | 136 | 150 | 138 | 139 | 153 | 159 | 164 | 166 | 149 |
| Silicon Wafer | 4" Dia. | 4" Dia. | 4" Dia. | 4" Dia. | 4" Dia. | 4" Dia. | 4" Dia. | 4" Dia. | 4" Dia. | 3" Dia. | 4" Dia. | 4" Dia. | 4" Dia. |
| Filament to Wafer Distance, mm | ~9 | ~9 | ~9 | ~11 | ~11 | ~13 | ~11 | ~11 | ~13 | ~11 | ~13 | ~13 | ~13 |
| Wafer Temp. °C. | ~660 | ~740 | ~700 | ~660 | ~660 | ~660 | ~740 | ~740 | ~740 | ~700 | ~700 | ~700 | ~700 |
| Ave. Filament Network Temp. | ~2010 | ~2140 | ~2080 | ~2020 | ~1980 | ~2080 | ~2130 | ~2180 | ~2160 | ~2050 | ~2120 | ~2050 | ~2150 |
| Flow Rate of 1% CH4 in H2, sccm | 88 | 88 | 132 | 45 | 132 | 88 | 45 | 132 | 88 | 45 | 45 | 88 | 132 |
| Total Pressure Torr | 30 | 30 | 30 | 30 | 30 | 30 | 30 | 30 | 30 | 30 | 30 | 30 | 30 |
| Deposition Time, Hrs. | 18 | 18 | 18 | 18 | 18 | 18 | 18 | 18 | 18 | 18 | 18 | 18 | 18 |
| PCD Film Thickness, μm | 1-2 | 1-2 | ~2 | ~1 | 1-2 | 1-2 | 1-2 | 1-2 | 1-2 | 1-2 | 1-2 | 1-2 | 1-2 |
| Surface Finish of PCD Film | 1* | 1* | 1* | 1* | 1* | 1* | 1* | 1* | 1* | 1* | 1* | 1* | 1* |
| PCD Membrane Quality | 3* | 3* | 3* | 3* | 3* | 3* | 3* | 3* | 3* | 2* | 2* | 2* | 2* |

Note: Wafer was rotated at ~5 revolutions per hour.
1* Smooth and shiny
2* Excellent, free of compressive stresses, and optically transparent
3* Film under compressive stresses but optically transparent

TABLE 3

| Example | 6A | 6B |
|---|---|---|
| Experiment No. | 200 | 217 |
| Silicon Wafer | 4" Dia. | 4" Dia. |
| Filament to Wafer Distance, mm | ~14 | ~14 |
| Wafer Temp, °C. | | |
| First Cycle | ~660 | ~680 |
| Second Cycle | ~680 | ~700 |
| No. Sets of Cycles | 2 | 2 |
| Flow Rate of 1% CH4 in H2, sccm | 45 | 45 |
| Total Presssure Torr | 30 | 30 |
| Deposition Time, Hrs. | 20 | 20 |
| PCD Film Thickness, μm | ~2 | ~2 |
| Surface Finish of PCT Film | 1* | 1* |
| PCD Membrane Quality | 2* | 2* |

Note: Wafer was rotated at ~5 revolutions per hour.
1* Smooth and shiny
2* Excellent, free of compressive stresses, and optically transparent
3* Film under compressive stresses but optically transparent

TABLE 4
X-RAY DIFFRACTION CHARACTERIZATION OF PCD FILMS

| Example No. | Relative Peak Intensity | | | | | Crystallite Size, Å | | | |
|---|---|---|---|---|---|---|---|---|---|
| | (111) | (220) | (311) | (400) | (331) | (111) | (220) | (311) | (400) |
| 143 | 100 | 68 | 14 | 4 | 18 | 260 | 590 | 470 | — |
| 139 | 100 | 7 | 22 | 28 | 6 | 380 | 600 | 650 | 900 |
| 149 | 100 | 23 | 9 | 3 | 11 | 390 | 430 | 300 | — |
| Diamond Powder[2] | 100 | 25 | 16 | 8 | 16 | — | — | — | — |

[1]Relative Peak Intensities based upon integrated peak areas normalized to (111) peak
[2]PDF 6-675; Torsik Committee for Powder Diffraction Standard/International Curtis Diffraction Data, Southmore, Pennsylvania

What is claimed is:

1. A substantially compressive stress free, pin-holes and defects free, continuous polycrystalline diamond thin membrane for X-ray lithography;
   said polycrystalline diamond membrane being substantially optically and X-ray transparent and having a substantially uniform thickness generally in the range of approximately 0.5 μm to 4.0 μm.

2. A X-ray lithography mask comprising:
   a substantially compressive stress-free, pin-holes and defects free, continuous polycrystalline diamond thin membrane;

said polycrystalline diamond membrane being substantially optically and X-ray transparent and having a substantially uniform thickness;

a substantially X-ray absorbing pattern supported by said membrane; and a substrate supporting said membrane.

3. The X-ray mask of claim 2 wherein the thickness of said polycrystalline diamond membrane is generally in the range of approximately 0.5 μm to 4.0 μm.

4. The X-ray mask of claim 2 wherein said polycrystalline diamond membrane has a diameter/thickness aspect ratio greater than 1,000.

5. The X-ray mask of claim 2 wherein said polycrystalline diamond membrane generally exhibits a tensile stress.

6. The X-ray mask of claim 2 wherein said polycrystalline diamond membrane generally exhibits a substantially wrinkle-free surface topography.

7. The X-ray mask of claim 2 wherein said substrate comprises a material selected from the group consisting of silicon, polysilicon, silicon carbide, silicon oxynitride, silicon nitride, boron carbide, boron nitride, alumina, titanium carbide, titanium nitride, tungsten, molybdenum, tantalum and mixtures thereof.

8. The X-ray mask of claim 2 wherein said X-ray absorbing pattern comprises a material selected from the group consisting of gold, nickel, tungsten, titanium, and tantalum or combination thereof.

9. A method for producing a substantially compressive stress free, pin-holes and defects free, continuous polycrystalline diamond X-ray membrane comprising:

preparing the surface of a supporting substrate comprising a material selected from the group consisting of silicon, polysilicon, silicon carbide, silicon nitride, silicon oxynitride, boron carbide, boron nitride, alumina, titanium carbide, titanium nitride, tungsten, molybdenum, tantalum and mixtures thereof by treating said substrate surface with a slurry of diamond particles and a volatile solvent placed in an ultrasonic bath for a predetermined period of time;

placing said substrate into a hot filament chemical vapor deposition reactor chamber;

pre-heating said substrate by electrically charging the pre-carburized filament network of said reactor to a temperature in the range of about 400° C. to 650° C. in the presence of an inert gas;

maintaining said pre-heating temperature for a predetermined period of time;

heating said substrate to a temperature in the range of approximately 650° C.–700° C. in the presence of a gaseous mixture of flowing hydrogen and carbon compounds;

chemically vapor depositing a substantially optically and X-ray transparent, adherent and coherent polycrystalline diamond membrane having a substantially uniform thickness onto said substrate;

cooling said substrate by extinguishing said deposition process and passing an inert gas over said substrate until the temperature of said substrate has reached substantially room temperature during said cooldown step;

removing said substrate coated with a substantially compressive stress free polycrystalline diamond X-ray membrane from said reactor;

applying an etch resistant mask to the back surface of the said substrate to define one or more openings;

etching said back surface of said substrate by preferential chemical etchant; and recovering said compressive stress free, pin-holes and defects free, continuous polycrystalline diamond membrane supported by a substrate frame.

10. The method of claim 9 wherein said diamond particles comprise 20 μm to 100 μm diamond powder.

11. The method of claim 9 wherein said diamond particles comprise 30 μm to 35 μm diamond powder.

12. The method of claim 9 wherein the distance between said substrate and said filament network is generally in the range of approximately 11 mm to 20 mm.

13. The method of claim 9 wherein the distance between said substrate and said filament network is generally in the range of approximately 11 mm to 15 mm.

14. The method of claim 9 wherein the distance between said substrate and said filament network is generally in the range of approximately 11 mm to 15 mm.

15. The method of claim 9 wherein the flow rate of said inert gas during said pre-heating step is generally in the range of approximately 50 sccm–500 sccm for approximately 10 min. to 120 min.

16. The method of claim 9 wherein said carbon compound is selected from the group consisting of $C_1$–$C_4$ saturated hydrocarbons, $C_1$–$C_4$ unsaturated hydrocarbons, gases containing C and O, aromatic compounds and organic compounds containing C, H, and at least one of O and/or N.

17. The method of claim 9 wherein said carbon compound is methane.

18. The method of claim 13 wherein the concentration of said carbon compound in said gaseous mixture is generally in the range of approximately 0.2% to 5.0%.

19. The method of claim 13 wherein the concentration of said carbon compound in said gaseous mixture is generally in the range of approximately 0.5% to 2.0%.

20. The method of claim 9 wherein said flow rate of said gaseous mixture during said chemical vapor deposition step is generally in the range of approximately 10 sccm to 605 sccm.

21. The method of claim 9 wherein the operating pressure of said reactor during said chemical vapor deposition step is generally in the range of approximately 10 Torr. to 100 Torr.

22. The method of claim 9 wherein said substrate is rotated at approximately 1 to 10 revolutions/hour during said pre-heating and said chemical vapor deposition steps.

23. The method of claim 9 wherein the deposition rate for said polycrystalline diamond membrane is generally in the range of approximately 0.05–0.5 microns/hour.

24. The method of claim 9 wherein said chemical vapor deposition time is generally in the range of approximately 5–80 hours.

25. The method of claim 9 wherein the thickness of said polycrystalline diamond membrane is generally in the range of approximately 0.5 μm–4 μm.

26. The method of claim 9 wherein said polycrystalline diamond membrane has a diameter/thickness aspect ratio greater than 100.

27. The method of claim 9 wherein said polycrystalline diamond membrane generally exhibits a tensile stress.

28. The method of claim 9 wherein said polycrystalline diamond membrane generally exhibits a substantially wrinkle-free surface topography.

29. The X-ray mask of claim 8 wherein the absorbing pattern is deposited by physical vapor or chemical vapor deposition techniques.

30. The polycrystalline diamond thin membrane of claim 1 wherein said membrane has a diameter/thickness ratio greater than 1,000.

31. The polycrystalline diamond thin membrane of claim 1 wherein said membrane exhibits a substantially wrinkle-free surface topography.

* * * * *

UNITED STATES PATENT AND TRADEMARK OFFICE
CERTIFICATE OF CORRECTION

PATENT NO. : 5,146,481

DATED : September 8, 1992

INVENTOR(S) : Garg, et al.

It is certified that error appears in the above-identified patent and that said Letters Patent is hereby corrected as shown below:

Column 2, line 46, "!%" should be —1%—.

Column 6, line 9, "I" should be —In—.

Column 13, line 35, "~" should be a dash — — —.

Column 15, line 7, "s**" should be —see—.

Column 24, line 15, "I1" should be —11—.

Column 2, line 21, "a" should be —an—.

Column 2, line 26, "a" should be —an—.

Column 2, line 53, "a" should be —an—.

Column 5, line 39, "HFVCD" should be —HFCVD—.

Column 7, line 4, "configure" should be —configured—.

Column 7, line 60, "form" should be —from—.

Column 9, line 2, "used" should be —use—.

Column 9, line 14, "provide" should be —provides—.

Column 9, line 14, "carburized" should —carburize—.

Column 9, line 21, delete "and" first occurrence.

Column 9, line 32, "an" should be —and—.

Column 9, line 37, delete "was" second occurrence.

UNITED STATES PATENT AND TRADEMARK OFFICE
CERTIFICATE OF CORRECTION

PATENT NO. : 5,146,481

DATED : September 8, 1992

INVENTOR(S) : Garg, et al.

It is certified that error appears in the above-identified patent and that said Letters Patent is hereby corrected as shown below:

Column 14, line 21, "the" should be —The—.

Column 16, line 2, after "than" insert —the—.

Column 17, line 4, "distant" should be —distance—.

Column 17, line 20, after "The" delete "15".

Signed and Sealed this

Nineteenth Day of October, 1993

Attest:

BRUCE LEHMAN

Attesting Officer

Commissioner of Patents and Trademarks